(12) United States Patent
Saxena et al.

(10) Patent No.: US 8,683,293 B2
(45) Date of Patent: Mar. 25, 2014

(54) METHOD AND SYSTEM FOR FAST TWO BIT ERROR CORRECTION

(75) Inventors: Nirmal Saxena, Los Altos Hill, CA (US); Howard Tsai, Cupertino, CA (US); Dmitry Vyshetsky, Cupertino, CA (US); Paul Gyugyi, Sunnyvale, CA (US)

(73) Assignee: Nvidia Corporation, Santa Clara, CA (US)

( * ) Notice: Subject to any disclaimer, the term of this patent is extended or adjusted under 35 U.S.C. 154(b) by 471 days.

(21) Appl. No.: 12/639,850

(22) Filed: Dec. 16, 2009

(65) Prior Publication Data

US 2011/0145677 A1 Jun. 16, 2011

(51) Int. Cl.
 *H03M 13/00* (2006.01)
(52) U.S. Cl.
 USPC .......................................... 714/759; 714/782
(58) Field of Classification Search
 None
 See application file for complete search history.

(56) References Cited

U.S. PATENT DOCUMENTS

| | | | |
|---|---|---|---|
| 4,360,916 A | 11/1982 | Kustedjo et al. | |
| 5,343,481 A * | 8/1994 | Kraft | 714/782 |
| 5,533,035 A | 7/1996 | Saxena et al. | |
| 5,734,926 A | 3/1998 | Feeley et al. | |
| 5,787,279 A | 7/1998 | Rigoutsos | |
| 5,878,279 A | 3/1999 | Athenes | |
| 6,000,006 A | 12/1999 | Bruce et al. | |
| 6,760,743 B1 | 7/2004 | Heddes et al. | |
| 6,772,276 B2 | 8/2004 | Dover | |
| 6,985,977 B2 | 1/2006 | Vrancic | |
| 7,100,103 B2 * | 8/2006 | Mizrachi et al. | 714/782 |
| 7,237,016 B1 | 6/2007 | Schober | |
| 7,392,330 B2 | 6/2008 | Weatherspoon | |
| 7,457,897 B1 | 11/2008 | Lee et al. | |
| 7,689,998 B1 | 3/2010 | Chrysanthakopoulos | |
| 7,761,636 B2 | 7/2010 | Mott et al. | |
| 7,877,254 B2 | 1/2011 | Luan et al. | |
| 7,877,524 B1 | 1/2011 | Annem et al. | |
| 8,108,590 B2 | 1/2012 | Chow et al. | |
| 2002/0078270 A1 | 6/2002 | Hofstee et al. | |
| 2002/0161941 A1 | 10/2002 | Chue et al. | |

(Continued)

FOREIGN PATENT DOCUMENTS

| | | |
|---|---|---|
| EP | 0502211 | 9/1992 |
| JP | 2004110438 A2 | 4/2004 |
| JP | 2007034581 A2 | 2/2007 |

OTHER PUBLICATIONS

"8237A High Performance Programmable DMA Controller", datasheet by Intel, Oct. 1989.

(Continued)

*Primary Examiner* — Michael Maskulinski

(57) ABSTRACT

An error locator unit for correcting two bit error. The error locator unit includes a plurality of operational units, a normalized basis transform unit, and a conversion unit. The plurality of operations units calculates coefficients of the polynomial based on the generated syndromes in a first basis of a Galois Field. Operating on the coefficients produces a root definition value vector in the first basis. The normalized basis transform unit transforms the root definition value vector to a normal basis to produce a plurality of roots. The conversion unit converts the plurality of roots to the first basis. A scaling factor calculated based on the coefficients is applied to the output of the conversion unit to produce a plurality of scaled roots for said polynomial in the first basis. The plurality of scaled roots is added to produce error locations for the polynomial.

21 Claims, 6 Drawing Sheets

(56) References Cited

U.S. PATENT DOCUMENTS

| | | |
|---|---|---|
| 2003/0172147 A1 | 9/2003 | Chang et al. |
| 2004/0044811 A1 | 3/2004 | Vrancic |
| 2004/0186946 A1 | 9/2004 | Lee |
| 2005/0057973 A1 | 3/2005 | Khatami et al. |
| 2005/0097183 A1 | 5/2005 | Westrelin |
| 2005/0160200 A1 | 7/2005 | Saito |
| 2005/0289253 A1 | 12/2005 | Edirisooriya et al. |
| 2006/0004931 A1 | 1/2006 | Weatherspoon |
| 2006/0136570 A1 | 6/2006 | Pandya |
| 2006/0152981 A1 | 7/2006 | Ryu |
| 2006/0236039 A1 | 10/2006 | Golander |
| 2007/0073920 A1 | 3/2007 | Wu et al. |
| 2008/0034153 A1 | 2/2008 | Lee et al. |
| 2008/0126684 A1 | 5/2008 | Wu et al. |
| 2008/0140910 A1 | 6/2008 | Flynn et al. |
| 2008/0250195 A1 | 10/2008 | Chow et al. |
| 2008/0270681 A1 | 10/2008 | Van Acht et al. |
| 2009/0002761 A1 | 1/2009 | La et al. |
| 2009/0070520 A1 | 3/2009 | Mizushima |
| 2009/0100307 A1 | 4/2009 | Lee |
| 2009/0150605 A1 | 6/2009 | Flynn et al. |
| 2009/0300318 A1 | 12/2009 | Allen et al. |
| 2010/0268864 A1 | 10/2010 | Ramiya Mothilal |
| 2011/0055668 A1* | 3/2011 | Kim et al. ............ 714/782 |

OTHER PUBLICATIONS

"Express APPS-PEX 8311", by PLX Technology, Jan. 2006.
"Wikipedia-Microcontroller" article found on http://web.archive.org from Nov. 27, 2007.
Advanced Semiconductor Memories Architecture, Designs, and Applications, Ashok Sharma, IEEE Press, 2003, at 393-401.

* cited by examiner

300

```
┌─────────────────────────────────────────────────────────────────────┐
│ Receiving two syndromes associated with a polynomial in a first    │
│ basis of a Galois Field                                             │
│ 310                                                                 │
└─────────────────────────────────────────────────────────────────────┘
                                  ↓
┌─────────────────────────────────────────────────────────────────────┐
│ Computing a first and a second coefficient based on the the        │
│ syndromes                                                           │
│ 320                                                                 │
└─────────────────────────────────────────────────────────────────────┘
                                  ↓
┌─────────────────────────────────────────────────────────────────────┐
│ Performing a first mathematical operation on the first and the     │
│ second coefficients                                                 │
│ 330                                                                 │
└─────────────────────────────────────────────────────────────────────┘
                                  ↓
┌─────────────────────────────────────────────────────────────────────┐
│ Converting the root definition value vector to a normalized basis  │
│ 340                                                                 │
└─────────────────────────────────────────────────────────────────────┘
                                  ↓
┌─────────────────────────────────────────────────────────────────────┐
│ Computing roots associated with the root definition value vector   │
│ in the normalized basis to produce a plurality of roots in the     │
│ normal basis                                                        │
│ 350                                                                 │
└─────────────────────────────────────────────────────────────────────┘
                                  ↓
┌─────────────────────────────────────────────────────────────────────┐
│ Converting the plurality of roots in the normal basis to the first │
│ basis resulting in a plurality of roots in the first basis         │
│ 360                                                                 │
└─────────────────────────────────────────────────────────────────────┘
                                  ↓
┌─────────────────────────────────────────────────────────────────────┐
│ Performing a second mathematical operation on the first and the    │
│ second coefficients to produce a scaling factor in the first basis │
│ 370                                                                 │
└─────────────────────────────────────────────────────────────────────┘
                                  ↓
┌─────────────────────────────────────────────────────────────────────┐
│ Scaling the plurality of roots in the first basis with the scaling │
│ factor to produce a plurality of scaled roots                      │
│ 380                                                                 │
└─────────────────────────────────────────────────────────────────────┘
                                  ↓
┌─────────────────────────────────────────────────────────────────────┐
│ Performing an addition function on the plurality of scaled roots   │
│ to produce error locations for the polynomial                      │
│ 390                                                                 │
└─────────────────────────────────────────────────────────────────────┘
                                  ↓
┌─────────────────────────────────────────────────────────────────────┐
│ Receiving coefficients associated with the polynomial and          │
│ generating a control signal to indicate whether a two bit error    │
│ has occurred                                                        │
│ 395                                                                 │
└─────────────────────────────────────────────────────────────────────┘
```

FIGURE 3

METHOD AND SYSTEM FOR FAST TWO BIT ERROR CORRECTION

TECHNICAL FIELD

The embodiments of the present invention relate to error correction. More particularly, embodiments of the present invention relate to two bit error correction for signals encoded via Bose-Chaudhuri-Hocquenghem (BCH) codes.

BACKGROUND ART

Generally most electronic devices are equipped with a form of error detection and error correction. For example, most DVD players, wireless devices, flash devices, etc., implement algorithms for error correction of encoded data. Algorithms used for error correction operate on data encoded via convolutional codes, e.g., Viterbi decode, and block codes, e.g., Reed-Solomon codes, turbo codes, Bose-Chaudhuri-Hocquenghem (BCH) codes, Reed-Muller codes, Binary Golay codes, etc.

Algorithms used for error correction may depend on the type of electronic device using the data and its application. For example, NAND flash technology may require high error correction, e.g., 16 bits. Accordingly, a BCH code may be used to correct t-errors in a given data block. The design of the BCH code is influenced by the number of error correction bits required and the data block size.

In general, error correction using BCH codes requires the syndromes to be generated from the encoded data. An error locator polynomial M(x) is calculated from the generated syndromes. The roots of the error locator polynomial M(x) are found in order to determine the location of the error bits.

Unfortunately, finding the roots of the error locator polynomial M(x) is an iterative process, e.g., using Chien's search, and can be very time consuming. The duration of the iterative process depends on the data block size and may take hundreds to thousands of clock cycles to complete.

Generally, one or two bit error conditions have a higher probability distribution in comparison to more than two bit errors. Thus, fast decoding procedures for one or two error bit conditions improves the effective bandwidth of BCH codes.

A hamming code may be used for correcting a single-error, thereby improving the number of clock cycles required. Faster decoding circuits have been developed for two bit errors, as described by Saxena et al., U.S. Pat. No. 5,533,035 and by Kustedjo et al., U.S. Pat. No. 4,360,916.

Unfortunately, the faster two bit error correction described by Saxena et al, and Kustedjo et al., are still iterative. Normally each potential error position is tried until the error is detected and corrected. Thus, the faster two bit error correction, as described by Saxena et al., and Kustedjo et al., while improving the effective bandwidth of BCH codes still require hundreds if not thousands of iterative clock cycles.

SUMMARY

Accordingly, a need has arisen to develop a non-iterative approach for correcting two bit errors in BCH encoded data ("BCH codes"). Moreover, a need has arisen to correct two bit errors in BCH codes in relatively few clock cycles. It will become apparent to those skilled in the art after reading the detailed description of the present invention that the embodiments of the present invention satisfy the above mentioned needs.

An error locator unit for correcting two bit errors for BCH codes may include a first plurality of operational units, a normalized basis transform unit, and a conversion unit. The error locator unit implements a non-iterative procedure for correcting two bit errors in BCH codes.

According to one embodiment, the first plurality of operational units receives two syndromes generated for a polynomial in a first basis of a Galois Field. The two syndromes are associated with a data block encoded with BCH codes. The first plurality of operational units calculates two coefficients of the polynomial based on the two syndromes and performs a mathematical operation on the two coefficients to produce a root definition value vector in the first basis.

The normalized basis transform unit transforms the root definition value vector to a normal basis to produce a plurality of roots in the normal basis. It is appreciated that the normal basis transforms a square operation in the first basis to a circular operation in the normal basis. According to one embodiment, a lookup table is used to access the normal basis. Furthermore, it is appreciated that the polynomial in the first basis may be associated with more than one normal basis.

In one embodiment, the conversion unit converts the plurality of roots in the normal basis to the first basis. The conversion results in a plurality of roots in the first basis.

It is appreciated that the error locator unit may further include a second plurality of operational units operable to compute a scaling factor based on the two coefficients calculated from the two syndromes. The error locator unit may also include a computational unit operable to scale the plurality of roots in the first basis by the scaling factor to produce a plurality of scaled roots for the polynomial in the first basis. It is appreciated that the computational unit is further operable to add the plurality of scaled roots to produce error locations for the polynomial.

According to one embodiment, an instant root of the plurality of roots in the first basis is equal to a root preceding the instant root in the first basis plus an instant normal basis root. The instant normal basis root is a root in the normal basis that corresponds to the instant root of the plurality of roots in the first basis.

According to one embodiment, the error locator unit includes a control unit operable to generate a control signal based on a plurality of coefficients of the polynomial in the first basis received from an error locator polynomial unit. The control signal indicates whether a two bit error has occurred. In one embodiment, the plurality of scaled roots added to one another is associated with error locations of the polynomial if the control signal indicates that a two bit error has occurred.

It is appreciated that the error locator unit for correcting two bit errors for BCH codes according to embodiments of the present invention is a non-iterative approach that takes very few clock cycles to complete. For example, the error locator unit according to embodiments of the present invention may complete their computation in 8 clock cycles.

As a result, a two bit error correction for BCH codes is developed where squaring in one basis is transformed to a circular shift in its normalized basis. Thus, a non-iterative procedure of the instant embodiments replaces the iterative process of the conventional art, thereby improving the effective bandwidth of BCH codes.

BRIEF DESCRIPTION OF THE DRAWINGS

Embodiments of the present invention are illustrated by way of example, and not by way of limitation, in the figures of the accompanying drawings and in which like reference numerals refer to similar elements and in which:

FIG. 3 shows an exemplary flow diagram for correcting two bit errors in BCH codes in accordance with one embodiment of the present invention.

DETAILED DESCRIPTION

Figure 1:
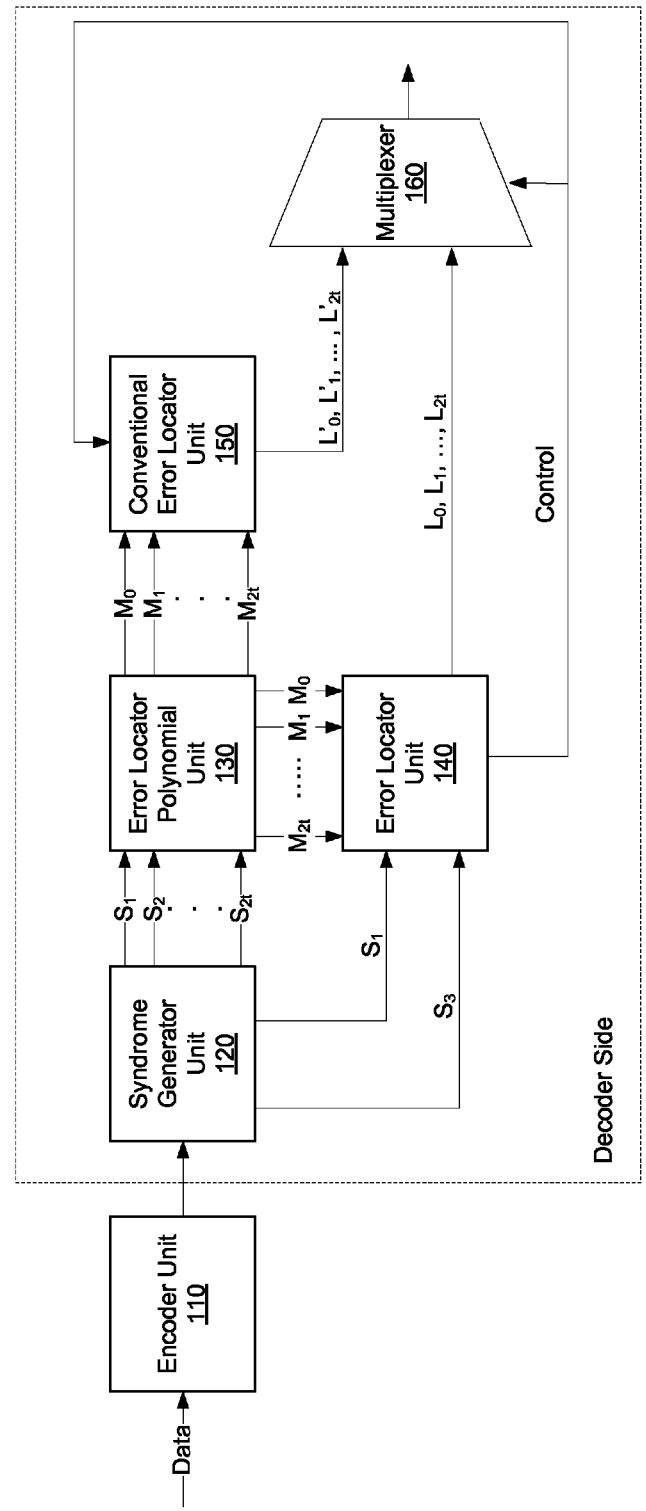
FIG. 1 shows a system for error correction of BCH codes in accordance with one embodiment.

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be evident to one of ordinary skill in the art that the present invention may be practiced without these specific details. In other instances, well known methods, procedures, components, and circuits have not been described in detail as not to unnecessarily obscure aspects of the invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the art to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities.

Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "creating" or "transferring" or "executing" or "determining" or "instructing" or "issuing" or "clearing" or "accessing" or "obtaining" or "selecting" or "calculating" or "measuring" or "querying" or "receiving" or "sending" or "providing" or "storing" or "incrementing" or "ordering" or "transmitting" or "computing" or "performing" or "converting" or "scaling" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Method and System for Fast Two Bit Error Correction

Referring now to FIG. 1, a system 100 for error correction of BCH codes in accordance with one embodiment is shown. The system 100 comprises an encoder unit 110, and a decoder side including a syndrome generator unit 120, an error locator polynomial unit 130, a novel error locator unit 140, a conventional error locator unit 150 and a multiplexer 160. It is appreciated that more than two bit error is referred to as "multi-bit error" throughout this application.

The encoder unit 110 on the encoder side receives a data block. The encoder unit 110 encodes the data block with error correcting code technology, e.g., Bose-Chaundhuri-Hocquenghem (BCH) codes. A t-error correcting BCH code is capable of correcting up to t errors in a given data block. It is appreciated that the design of the BCH code may depend on the size of the data block. It is appreciated that the probability distribution of one bit error and two bit error are exponentially higher in comparison to probability distribution of multi-bit error. A one bit error may be corrected using hamming codes. Embodiments of the present invention are employed to correct a two bit error because occurrence of a two bit error is exponentially more likely than the probability distribution of multi-bit error.

Embodiments of the present invention compute the locations of two bit errors using a non-iterative approach whereas the conventional approach uses an iterative approach. The non-iterative approach of embodiments of the present invention transforms a squaring operation of a two bit error into a shift operation. Squaring operation of the iterative approach of the conventional approach is computationally intensive, e.g., may require hundreds and thousands of clock cycles. In comparison, the shift operation for non-iterative approach of the embodiments of the present invention is computationally less intensive. For example, the non-iterative approach may only require 8 clock cycles. As a result, the embodiments of the present invention improve the effective bandwidth of BCH codes and significantly reduce the number of clock cycles required.

The encoded data block is received at the decoder side by the syndrome generator unit 120. The syndrome generator unit 120 generates the syndromes, e.g., $S_1, S_2, \ldots, S_{2t}$, for the encoded data block using well known techniques. The generated syndromes are transmitted to the error locator polynomial unit 130. The generated syndromes, e.g., $S_1, S_2, \ldots, S_{2t}$, are used by the error locator polynomial unit 130 to generate the coefficients of the error locator polynomial. The error locator polynomial is:

$$M(x) = (1+\alpha^i x) \ldots (1+\alpha^k x) = 1 + (\alpha^i + \alpha^j + \ldots + \alpha^k)x + \ldots + (\alpha^i + \alpha^j + \ldots + \alpha^k)x^{2t}$$

where i, j, and k are unknown locations of error bits and where $M_0 = M[0] = 1$, $M_1 = M[1] = \alpha^i + \alpha^j + \ldots + \alpha^k$, ..., and $M_{2t} = M[2t] = \alpha^{i+j+\ldots+k}$ are known coefficients of the polynomial $M(x)$.

It is appreciated that finding the error locations based on the polynomial $M(x)$ determines the locations of the error bits. The coefficients $M_0, M_1, \ldots,$ and $M_{2t}$ are used by the conventional error locator unit 150 to determine the locations of error bits without any presumption regarding the number of error bits. It is appreciated that searching for the roots of the polynomial is performed in a Galois Field (GF) ($2^m$) where 2 represents binary numbers and m represents the order of the polynomial. The conventional error locator unit 150 uses an iterative search, e.g., Chien's search, in Galois Field to find the roots of the polynomial, thereby determining the error locations. The conventional error locator unit 150 outputs the result of the search, e.g., $L'_0, L'_1, \ldots, L'_{2t}$.

Presuming that a two bit error has occurred, the error locator polynomial becomes $M(x)=1+(\alpha^i+\alpha^j)x+(\alpha^{i+j})x^2$. It is well known that $M_1=S_1^2$ and $M_2=S_1^{-1}S_3$ for a two bit error. Accordingly, embodiments of the present invention need not delay finding the error locations until the polynomial is completely generated by the error locator polynomial unit 130 because the coefficients of the polynomial, e.g., $M_1$ and $M_2$, can be calculated from $S_1$ and $S_3$ directly. In other words, error locator unit 140 in accordance with embodiments of the present invention can commence operating once $S_1$ and $S_3$ are known.

The error locator unit 140 receives the syndromes $S_1$ and $S_3$. The error locator unit 140 uses the received syndromes to calculate the error locations in a few clock cycles, e.g., 8 clock cycles, presuming that only a two bit error has occurred. The error locator unit 140 is a non-iterative error locator and therefore calculates the error locations in a few clock cycles as opposed to a few hundred or a few thousand clock cycles of the conventional approach. The error locator unit 140 improves efficiency by transforming a squaring operation for the polynomial with two error bit in to a circular shift operation. A description for calculating locations for a two bit error is described in FIG. 2 below.

The error locator unit 140 further receives the coefficients of the polynomial calculated by the error locator polynomial unit 130. The error locator unit 140 uses the received coefficients of the polynomial to verify whether the presumption is correct that only a two bit error has occurred. For example, the error locator unit 140 may compare the received coefficients with the calculated coefficients from $S_1$ and $S_3$ syndromes. The occurrence of a two bit error is confirmed if the received coefficients match those calculated by the error locator unit 140. In response to the verification, the error locator unit 140 generates a control signal to the multiplexer 160. In another embodiment, the error locator unit 140 determines that the presumption is false if the $M_0$ coefficient received from the error locator polynomial unit 130 is zero.

It is appreciated that by the time that the error locations and the control signal are generated by the error locator unit 140, the conventional error locator unit 150 is operating and is performing an exhaustive search to find the roots of the error locator polynomial. The error locations computed by the error locator unit 140 and the control signal are input to a switching mechanism, e.g., the multiplexer 160. If the control signal confirms that a two bit error has occurred, then the multiplexer 160 outputs the error locations $L_0, L_1, \ldots, L_{2t}$ from the error locator unit 140 without having to wait for the results of the conventional error locator unit 150. As a result, finding the error locations is performed in a few clock cycles as opposed to many hundreds and thousands of clock cycles of the conventional approach. On the other hand, if the control signal indicates that two bit error has not occurred, then the multiplexer 160 does not output the error locations $L_0, L_1, \ldots, L_{2t}$ from the error locator unit 140 and awaits the result from the conventional error locator unit 150 assuming an error occurred.

Accordingly, employing the iterative approach to correct a two bit error significantly improves the effective bandwidth of decoding BCH codes. For example, the iterative approach can locate errors in 8 clock cycles.

Figure 2:
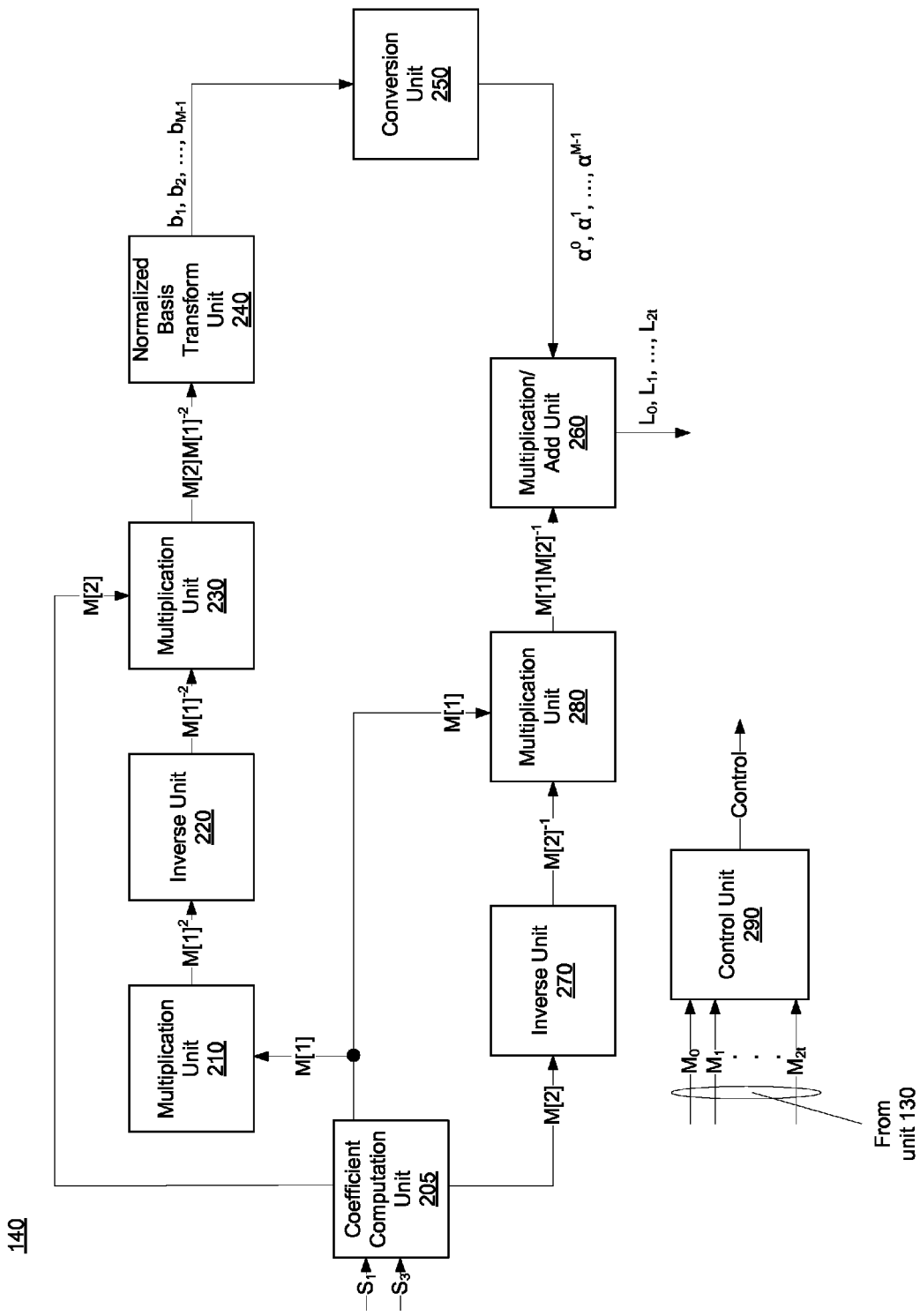
FIG. 2 shows an error locator unit in accordance with one embodiment of the present invention.

Referring now to FIG. 2, the error locator unit 140 in accordance with one embodiment of the present invention is shown. As described above, the error locator polynomial becomes $M(x)=1+(\alpha^i+\alpha^j)x+(\alpha^{i+j})x^2$ when a two bit error occurs. It is well known that $M_0=1$, $M_1=S_1^2$ and $M_2=S_1^{-1}S_3$ when a two bit error occurs. The error locator polynomial $M(x)$ can be rewritten as:

$$M(x)=ax^2+bx+c, \text{ where } a=M_2, b=M_1 \text{ and } c=M_0$$

Finding the roots of the error locator polynomial of the second order in the Galois Field requires a squaring operation that takes many clock cycles. Embodiments of the present invention take advantage of transforming the squaring operation of the Galois Field in to a circular shift operation in its normalized basis that requires a few clock cycles, e.g., less than 10 clock cycles, to find their respective roots.

It is appreciated that more than one normalized basis may be possible for any given polynomial. Thus, one or more normalized basis may be stored in a memory component and the desired normalized basis may be selected accordingly.

Transforming the error locator polynomial into a normalized basis and replacing x with bz/a results in:

$$b^2/a \; (Z^2+Z+\beta)=0 \text{ where } \beta=a/b^2=M_2/M_1^2$$

$Z^2+Z+\beta=0$ can be written as $Z^2+Z=\beta$. Solving the equation results in $\beta$ where $\beta$ is a vector, e.g., $\beta=[b_0, b_1, b_2, \ldots, b_{M-1}]$. Transforming from the normalized basis back to the original Galois Field provides the error locations e.g., $\alpha^0, \alpha^1, \ldots, \alpha^{M-1}$, for the error locator polynomial $M(x)$ where $\alpha^0=b_0$, $\alpha^1=b_0+b_1, \ldots, \alpha^{M-1}=b_0+b_1+\ldots+b_{M-1}$.

The error locations $\alpha^0, \alpha^1, \ldots, \alpha^{M-1}$ are now scaled back by a factor of b/a because x=bz/a. The scaled error locations are added to generate the error locations $L_0, L_1, \ldots, L_{2t}$.

Accordingly, the computationally intensive quadratic equation in the original Galois Field has been transformed to a circular shift operation by transformation of coefficients into a normalized basis, thereby substantially reducing the number of clock cycles needed to find the error locations. Components of the error locator unit 140 to achieve the above objective are now described. The error locator unit 140 comprises a coefficient computation unit 205 operable to receive the syndromes $S_1$ and $S_3$ and to compute M[1] and M[2], as described above.

The error locator unit 140 of FIG. 2 comprises a multiplication unit 210, an inverse unit 220, and a multiplication unit 230 in order to compute $\beta$. The multiplication unit 210 receives the calculated M[1] and outputs M[1]$^2$. The output of the multiplication unit 210 is input to the inverse unit 220 in order to provide $1/M_1^2$. The multiplication unit 230 receives $1/M_1^2$ from the inverse unit 220 and further receives $M_2$ from the coefficient computation unit 205. Accordingly, the multiplication unit 230 produces $\beta$ by multiplying $M_2$ and $1/M_1^2$.

The output of the multiplication unit 230 is transformed into a normalized basis by accessing a table where the normalized basis (one or more) is stored. The normalized basis transform unit 240 transforms $\beta$ to a normalized basis producing a vector $[b_0, b_1, b_2, \ldots, b_{M-1}]$. A conversion unit 250 transforms the vector $[b_0, b_1, b_2, \ldots, b_{M-1}]$ from the normalized basis back to the original Galois Field. Accordingly, the error locations e.g., $\alpha^0, \alpha^1, \ldots, \alpha^{M-1}$, for the error locator polynomial $M(x)$ can be found where $\alpha^0=b_0$, $\alpha^1=b_0+b_1, \ldots, \alpha^{M-1}=b_0+b_1+\ldots+b_{M-1}$.

A multiplication/add unit 260 scales the roots back by a factor of b/a because x=bz/a and adds them in order to form the polynomial with their error locations, e.g., $L_0, L_1, \ldots, L_{2t}$. The scaling factor b/a may be generated using an inverse unit 270 and a multiplication unit 280. For example, the inverse unit 270 may receive M[2] from the coefficient computation unit 205 and inverse it to produce 1/M[2]. The multiplication unit 280 may receive M[1] from the coefficient computation unit 205 and further receive 1/M[2] from the inverse unit 270. Thus, the scaling factor b/a or M[1]/M[2] may be generated when the multiplication unit 280 multiplies the two inputs.

It is appreciated that the error locator unit 140 may further include a control unit 290. The control unit 290 receives coefficients of the error locator polynomial M(x) from the error locator polynomial unit 130. The control unit 290 uses the received coefficients from the error locator polynomial unit 130 to verify whether the presumption that a two bit error has occurred is correct. For example, the control unit 290 may compare the received coefficients from the error locator polynomial unit 130 to the calculated coefficients of the coefficient computation unit 205. The control signal may indicate that a two bit error has occurred if there is a match and it may indicate otherwise if there is no match, for instance.

FIG. 3 shows an exemplary flow diagram 300 for correcting two bit errors in BCH codes in accordance with one embodiment of the present invention. At step 310, two of the syndromes, e.g., $S_1$ and $S_3$, associated with an error locator polynomial are received by an error locator unit 140. It is appreciated that the syndromes are generated in a Galois Field by the syndrome generator unit 120.

At step 320, using the two received syndromes, a first and a second coefficient, e.g., $M_1$ and $M_2$, for the error locator polynomial are calculated by the coefficient computation unit 205, for instance. At step 330, a first mathematical operation is performed on the first and the second coefficient. For example, $M[2]M[1]^{-2}$ is calculated in the Galois Field. The first mathematical operation results in a root definition value vector. At step 340, the root definition value vector is transformed and converted into its normalized basis, e.g., using the normalized basis transform unit 240. At step 350, roots associated with the root definition value vector in the normalized basis is computed to produce a plurality of roots in the normalized basis, e.g., $\beta=[b_0, b_1, b_2, \ldots, b_{M-1}]$.

At step 360, the plurality of roots in the normalized basis is converted back to the original Galois Field basis to produce a plurality of roots in the original Galois Field basis. A second mathematical operation is performed in the Galois Field to produce a scaling factor, e.g., M[1]/M[2], at step 370. Accordingly, the plurality of roots in the original Galois Field basis is scaled by the scaling factor at step 380 in order to produce a plurality of scaled roots.

At step 390, the plurality of scaled roots is added together to produce error locations of the error locator polynomial. It is appreciated that at step 395 the error locator unit 140 generates a control signal in order to verify whether the presumption that a two bit error has occurred is correct. The error locations found by the error locator unit 140 are used as proper error locations if the control signal verifies the validity of the presumption that a two bit error has occurred. As a result, hundreds if not thousands of clock cycles are saved. On the other hand, if the presumption is not valid, then the system awaits the results from the conventional error locator unit 150.

Figure 4:
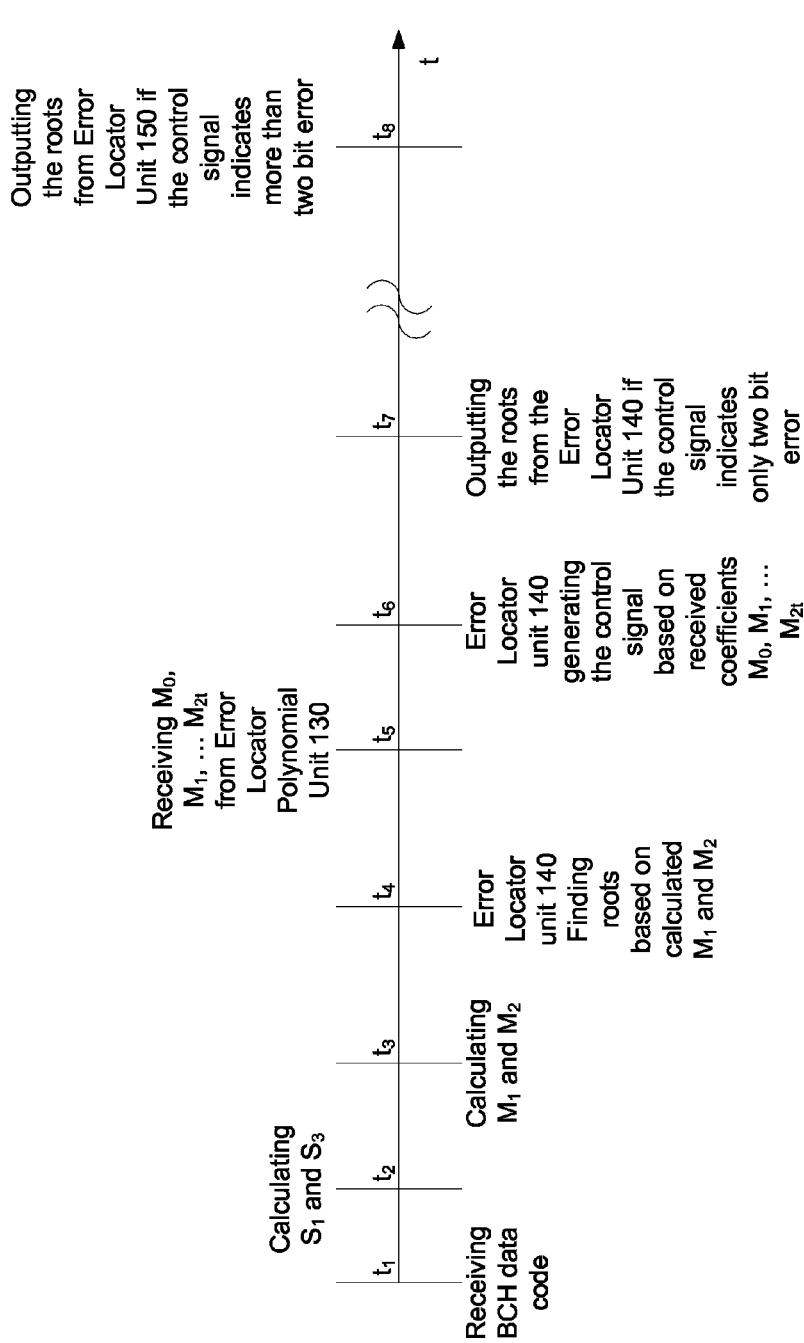
FIG. 4 shows an exemplary timing diagram for correcting two bit errors in BCH codes in accordance with one embodiment of the present invention.

Referring now to FIG. 4, an exemplary timing diagram for correcting two bit errors in BCH codes in accordance with one embodiment of the present invention is shown. According to one embodiment, at time $t_1$, BCH encoded data is received. At time $t_2$ syndromes associated with the error locator polynomial are generated including syndromes $S_1$ and $S_3$. It is appreciated that at time $t_3$ the coefficient computation unit 205 of the error locator unit 140 calculates coefficients $M_1$ and $M_2$ from the syndromes $S_1$ and $S_3$ while the error locator polynomial 130 is operating.

According to one embodiment, at time $t_4$ the error locator unit 140 finds the roots based on the calculated coefficients $M_1$ and $M_2$. At time $t_5$, the error locator unit 140 receives the coefficients from the error locator polynomial unit 130. It is appreciated that the event associated with $t_5$ may occur prior to the event associated with $t_4$ but typically does not. The error locator unit 140 utilizes the received coefficients to generate a control signal, at time $t_6$. The control signal verifies whether the presumption that a two bit error has occurred is correct.

It is appreciated that during the time which the error locator unit 140 is finding the roots and is generating the control signal, the conventional error locator unit 150 may be operating in parallel to find the roots of the error locator polynomial, e.g., using Chien's search. At time $t_7$, the multiplexer 160 outputs the roots found by the error locator unit 140 if the control signal verifies that the presumption that a two bit error has occurred. If the control signal verifies the presumption, the operation of the conventional error locator unit 150 may be stopped.

However, if the control signal indicates that the presumption that a two bit error has occurred is incorrect, the conventional error locator unit 150 continues to search and find the roots associated with the error locator polynomial. Accordingly, at time $t_8$, which is hundreds if not thousands of clock cycles after $t_7$, the conventional error locator unit 150 finds the roots of the error locator polynomial. The multiplexer 160 outputs the result of the search by the conventional error locator unit 150.

Figure 5:
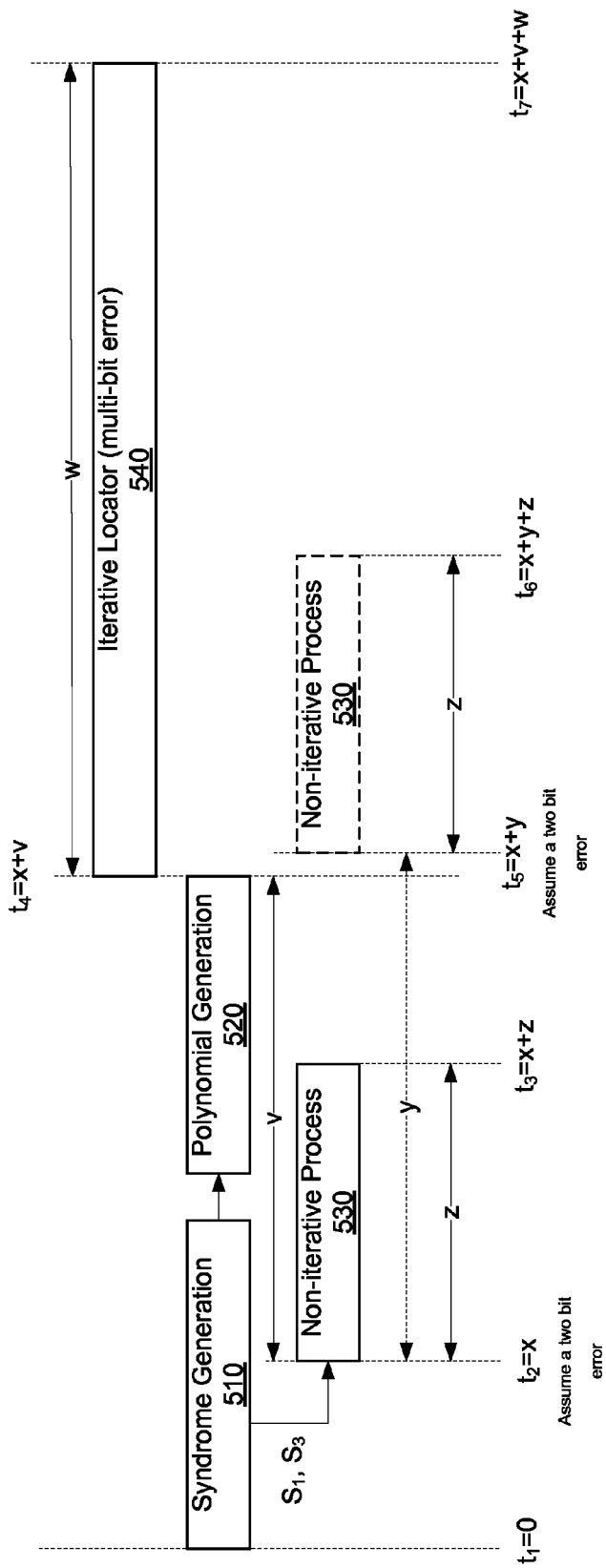
FIG. 5 shows an exemplary timing diagram comparison between a conventional approach and one embodiment of the present invention.

Referring now to FIG. 5, an exemplary timing diagram comparison between a conventional approach and one embodiment of the present invention is shown. At time $t_1$, the syndrome generation 510 is initiated. Coefficients of the polynomial are generated by the polynomial generation 520 after the syndrome generation 510 completes the generation of the syndromes. For example, the coefficients are generated at time $t_4=x+v$.

The non-iterative process 530 may be initiated any time after syndromes $S_1$ and $S_3$ are generated. For example, the non-iterative process 530 may be initiated at time $t_2=x$, which is before the syndrome generation 510 completes the syndrome generation. In one exemplary embodiment, the non-iterative process 530 may be initiated after the coefficients of the polynomial have been generated by the polynomial generation 520, e.g., at time $t_5=x+y$ where $y>v$.

The non-iterative process 530 requires a few clock cycles, e.g., $z=8$ clock cycles, to complete. For example, the non-iterative process 530 completes finding the error locations at time $t_3=x+z$ if the process starts at time $t_2$. On the other hand, the non-iterative process 530 completes finding the error locations at time $t_6=x+y+z$ if the process starts at time $t_5$.

In contrast, the iterative locator 540 starts after the polynomial generation 520 completes its operation, e.g., at time $t_4=x+v$. The iterative locator 540 approach requires w clock cycles to complete which is hundreds if not thousands of clock cycles. The operation of the non-iterative approach requires a lot less clock cycles than the iterative approach. For example, $w>>z$. The iterative locator 540 completes its operation at time $t_7=w+x+v$ where $w>>z$. Thus, $t_7$ occurs many thousands of clock cycles after the completion, e.g., $t_3$ or $t_6$, of the process by the non-iterative process 530.

Accordingly, a non-iterative method for correcting two bit errors in BCH codes is implemented. The non-iterative approach require only a few clock cycles to find the roots associated with the error locator polynomial whereas the conventional iterative approach requires many hundreds and thousands of clock cycles. The non-iterative approach improves the efficiency and the time required to correct two bit error considering that the occurrence of a two bit error is exponentially more likely than multi-bit error. Thus, the effective bandwidth of BCH codes is improved.

Figure 6:
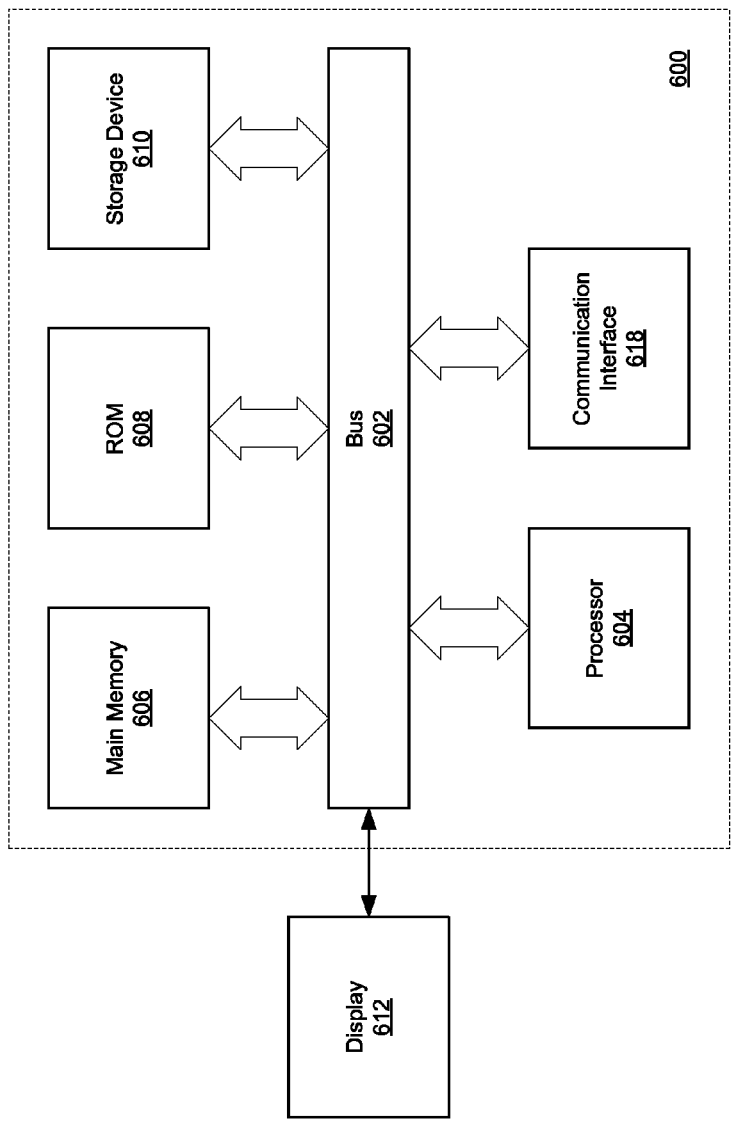
FIG. 6 illustrates a general purpose computer system that may serve as a platform for embodiments of the present invention.

FIG. 6 is a block diagram that illustrates a computer system platform 600 upon which an embodiment of the invention may be implemented. Computer system 600 may implement the process for fast two bit error correction as shown in FIGS. 1-5. The computer system 600 includes a bus 602 or other communication mechanism for communicating information, and a processor 604 coupled with bus 602 for processing information.

Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Computer system 600 further includes a read only memory (ROM) 608 or other static storage device coupled to bus 602 for storing static information and instructions for processor 604. A non-volatile storage device 610, such as a magnetic disk or optical disk, is provided and coupled to bus 602 for storing information and instructions and may store the persistent internal queue. According to one embodiment, the instructions for implementing the virtual device may be stored on any one of the memory components (e.g., RAM, ROM, non-volatile storage device and etc.). Computer system 600 may be coupled via bus 602 to an optional display 612 for displaying information to a computer user.

The term "computer-readable medium" as used herein refers to any medium that participates in providing instructions to processor 604 for execution. Such a medium may take many forms, including but not limited to, non-volatile media, volatile media, and transmission media. Non-volatile media includes, for example, optical or magnetic disks, such as storage device 610. Volatile media includes dynamic memory, such as main memory 606. Transmission media includes coaxial cables, copper wire and fiber optics, including the wires that comprise bus 602. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

In the foregoing specification, embodiments of the invention have been described with reference to numerous specific details that may vary from implementation to implementation. Thus, the sole and exclusive indicator of what is, and is intended by the applicants to be, the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An error locator unit for correcting a two bit error, said error locator unit comprising:
    a first plurality of operational units operable to receive two syndromes generated for a polynomial in a first basis of a Galois Field associated with a data block encoded with a Bose-Chaundhuri-Hocquenghem (BCH) code, and wherein said first plurality of operational units is further operable to calculate two coefficients of said polynomial based on said two syndromes, and wherein said first plurality of operational units is operable to perform a mathematical operation on said two coefficients to produce a root definition value vector in said first basis;
    a normalized basis transform unit operable to transform said root definition value vector to a normal basis to produce a plurality of roots in said normal basis; and
    a conversion unit operable to convert said plurality of roots in said normal basis to said first basis, wherein said conversion results in a plurality of roots in said first basis.

2. The error locator unit as described by claim 1 further comprising:
    a second plurality of operational units operable to compute a scaling factor based on said two coefficients.

3. The error locator unit as described by claim 2 further comprising:
    a computational unit operable to scale said plurality of roots in said first basis by said scaling factor to produce a plurality of scaled roots for said polynomial in said first basis, and wherein said computational unit is further operable to add said plurality of scaled roots to produce error locations for said polynomial.

4. The error locator unit as described by claim 1 further comprising:
    a control unit operable to receive a plurality of coefficients for said polynomial in said first basis, wherein said control unit is operable to generate a control signal based on said plurality of coefficients, wherein said control signal indicates whether a two bit error has occurred.

5. The error locator unit as described by claim 4, wherein a plurality of scaled roots added to one another is associated with error locations of said polynomial if said control signal indicates that a two bit error has occurred, wherein said plurality of scaled roots is said plurality of roots in said first basis scaled by a scaling factor.

6. The error locator unit as described by claim 1, wherein said normal basis transforms a square operation in said first basis to a circular operation in said normal basis.

7. The error locator unit as described by claim 1, wherein a lookup table is used to access said normal basis.

8. The error locator unit as described by claim 1, wherein said polynomial in said first basis is associated with more than one normal basis.

9. The error locator unit as described by claim 1, wherein an instant root of said plurality of roots in said first basis is equal to a root preceding said instant root in said first basis plus an instant normal basis root, wherein said instant normal basis root is a root in said normal basis that corresponds to said instant root of said plurality of roots in said first basis.

10. A method of correcting two bit error, said method comprising:
    receiving, within an electronic system, two syndromes associated with a polynomial in a first basis of a Galois Field associated with a data block encoded with a Bose-Chaundhuri-Hocquenghem (BCH) code;
    computing a first and a second coefficient based on said two syndromes;

performing a first mathematical operation on said first and said second coefficients to produce a root definition value vector in said first basis;

converting said root definition value vector to a normalized basis;

computing roots associated with said root definition value vector in said normalized basis to produce a plurality of roots in said normal basis; and converting said plurality of roots in said normal basis to said first basis resulting in a plurality of roots in said first basis.

11. The method as described in claim 10, wherein said first mathematical operation comprises inversing a square of said first coefficient and multiplying said inverse of said square of said first coefficient with said second coefficient, wherein said first coefficient is a coefficient of a first order variable and said second coefficient is a coefficient for a second order variable.

12. The method as described in claim 10 further comprising:

performing a second mathematical operation on said first and said second coefficients to produce a scaling factor in said first basis.

13. The method as described in claim 12, wherein said scaling factor comprises an inverse of said second coefficient multiplied by said first coefficient.

14. The method as described in claim 12 further comprising:

scaling said plurality of roots in said first basis with said scaling factor to produce a plurality of scaled roots; and performing an addition function on said plurality of scaled roots to produce error locations for said polynomial.

15. The method as described in claim 10 further comprising:

receiving a plurality of coefficients for said polynomial in said first basis; and generating a control signal based on said plurality of coefficients, wherein said control signal indicates whether a two bit error has occurred.

16. The method as described in claim 10, wherein an instant root of said plurality of roots in said first basis is equal to a root preceding said instant root in said first basis plus an instant normal basis root, wherein said instant normal basis root is a root in said normal basis that corresponds to said instant root of said plurality of roots in said first basis.

17. The method as described in claim 10, wherein said plurality of roots in said normal basis are produced via a shift operation.

18. An error correction circuit comprising:

a syndrome generator operable to receive encoded data and producing a plurality of syndrome bits;

an error locator polynomial circuit operable to receive said plurality of syndrome bits and for producing a plurality of coefficient bits therefrom;

an iterative error locator unit operable to receive said plurality of coefficient bits and for producing a plurality of error location bits therefrom; and a non-iterative error locator unit operable to receive two bits of said plurality of syndrome bits and for producing two error location bits corresponding to presumed a two bit error within said encoded data.

19. An error correction circuit as described in claim 18 further comprising a multiplexer coupled to said iterative error locator unit and to said non-iterative error locator unit and operable to output said two error location bits of said non-iterative error locator unit upon a detection of a two bit error.

20. An error correction circuit as described in claim 19 wherein said non-iterative error locator unit is operable in parallel with said error locator polynomial circuit.

21. An error correction circuit as described in claim 19 wherein said detection of said two bit error occurs upon generation of a portion of said plurality of coefficient bits and wherein further said encoded data is encoded via a Bose-Chaundhuri-Hocquenghem (BCH) code.

* * * * *